(12) United States Patent  (10) Patent No.: US 9,048,294 B2
Tang et al.  (45) Date of Patent: Jun. 2, 2015

(54) METHODS FOR DEPOSITING MANGANESE AND MANGANESE NITRIDES

(71) Applicant: Applied Materials, Inc., Santa Clara, CA (US)

(72) Inventors: Jing Tang, Cupertino, CA (US); Zhefeng Li, Santa Clara, CA (US); Paul F. Ma, Santa Clara, CA (US); David Thompson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/860,618

(22) Filed: Apr. 11, 2013

(65) Prior Publication Data

US 2013/0273733 A1    Oct. 17, 2013

Related U.S. Application Data

(60) Provisional application No. 61/623,972, filed on Apr. 13, 2012.

(51) Int. Cl.
*H01L 21/768* (2006.01)
*C23C 16/34* (2006.01)
*H01L 21/285* (2006.01)
*H01L 23/532* (2006.01)

(52) U.S. Cl.
CPC .......... *H01L 21/76843* (2013.01); *C23C 16/34* (2013.01); *H01L 21/28556* (2013.01); *H01L 21/28562* (2013.01); *H01L 23/53238* (2013.01); *H01L 21/76846* (2013.01); *H01L 21/76856* (2013.01); *H01L 21/76862* (2013.01); *H01L 21/76867* (2013.01)

(58) Field of Classification Search
None
See application file for complete search history.

(56) References Cited

U.S. PATENT DOCUMENTS

| 6,821,563 | B2 | 11/2004 | Yudovsky |
| 6,878,206 | B2 | 4/2005 | Tzu et al. |
| 6,916,398 | B2 | 7/2005 | Chen et al. |
| 7,253,097 | B2 | 8/2007 | Lim et al. |
| 7,780,785 | B2 | 8/2010 | Chen et al. |
| 7,932,176 | B2 | 4/2011 | Gordon et al. |
| 8,206,552 | B2 | 6/2012 | Chen et al. |
| 8,569,165 | B2 | 10/2013 | Gordon et al. |
| 2004/0121616 | A1* | 6/2004 | Satta et al. ............. 438/778 |

(Continued)

FOREIGN PATENT DOCUMENTS

KR   2006-0042167   5/2006
KR   10-2009-0010089   1/2009

OTHER PUBLICATIONS

Baxter et al., Molecular Routes to Metal Carbides, Nitrides, and Oxides. 2. Studies of the Ammonolysis of Metal Dialkylamides and Hexamethyldisilylamides, Chem. Mater. 1996, 8, 1222-1228.*

(Continued)

*Primary Examiner* — Charles Garber
*Assistant Examiner* — Alia Sabur
(74) *Attorney, Agent, or Firm* — Servilla Whitney LLC

(57) ABSTRACT

Described are manganese-containing films, as well as methods for providing the manganese-containing films. Doping manganese-containing films with Co, Mn, Ru, Ta, Al, Mg, Cr, Nb, Ti or V allows for enhanced copper barrier properties of the manganese-containing films. Also described are methods of providing films with a first layer comprising manganese silicate and a second layer comprising a manganese-containing film.

18 Claims, 3 Drawing Sheets

(56) References Cited

U.S. PATENT DOCUMENTS

| | | | |
|---|---|---|---|
| 2005/0218519 A1 | 10/2005 | Koike et al. | |
| 2007/0020923 A1* | 1/2007 | Kraus et al. | 438/644 |
| 2008/0254232 A1 | 10/2008 | Gordon et al. | |
| 2009/0120787 A1 | 5/2009 | Okamura et al. | |
| 2009/0257927 A1 | 10/2009 | Ramaswamy et al. | |
| 2010/0035428 A1 | 2/2010 | Nakao et al. | |
| 2011/0049716 A1 | 3/2011 | Yang et al. | |
| 2011/0136339 A1 | 6/2011 | Gambino et al. | |
| 2011/0163062 A1* | 7/2011 | Gordon et al. | 216/13 |
| 2012/0025380 A1 | 2/2012 | Neishi et al. | |
| 2012/0043023 A1 | 2/2012 | Ramaswamy et al. | |
| 2013/0270702 A1 | 10/2013 | Yu et al. | |

OTHER PUBLICATIONS

Parker Clark, NNIN REU Conference Proceedings 2011.*

(Spicer, Charles W., Synthesis, characterization and chemical vapor deposition of transition metal di(tert-butyl)amido compounds, Thesis Dissertation, Univ. of Illinois, 2008).*

PCT International Search Report and Written Opinion in PCT/US2013/036407 mailed Jul. 26, 2013, 11 pages.

Au, Yeung et al., "Filling Narrow Trenches by Iodine-Catalyzed CVD of Copper and Manganese on Manganese Nitride Barrier/Adhesion Layers", *Journal of The Electrochemical Society*, vol. 158, (2011) pp. D248-D253.

Au, Yeung et al., "Selective Chemical Vapor Deposition of Manganese Self-Aligned Capping Layer for Cu Interconnections in Microelectronics", *Journal of The Electrochemical Society*, vol. 157 (2010) pp. D341-D345.

Non-Final Office Action in U.S. Appl. No. 13/905,932, dated Jun. 10, 2014, 19 pages.

PCT International Preliminary Report on Patentability in PCT/US2013/036407, mailed Oct. 23, 2014, 8 pages.

PCT International Search Report and Written Opinion in PCT/US2014/040239, mailed Oct. 27, 2014, 13 pages.

Final Office Action in U.S. Appl. No. 13/905,932, dated Dec. 26, 2015, 8 pages.

* cited by examiner

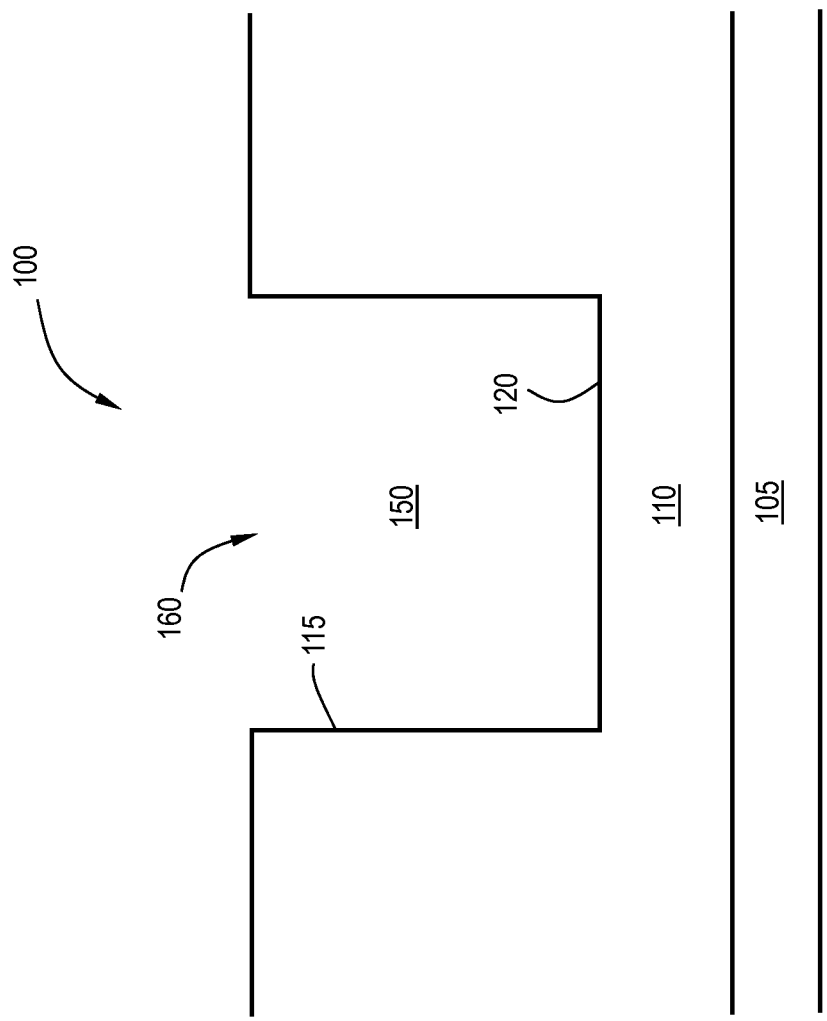

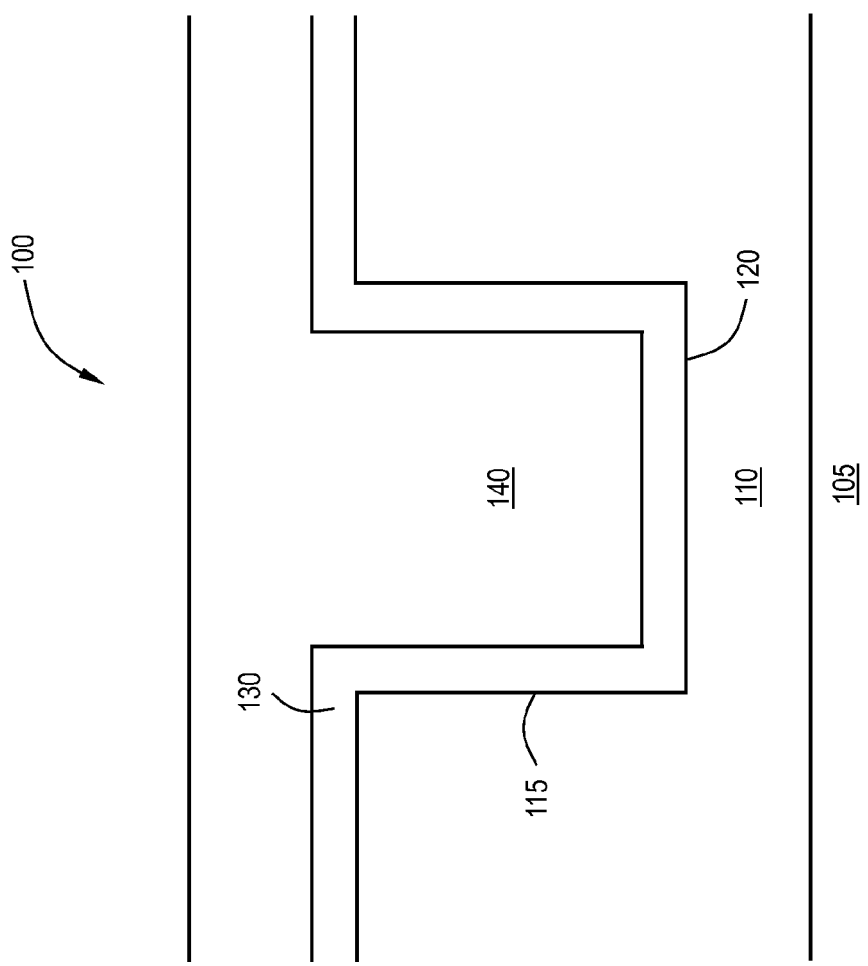

METHODS FOR DEPOSITING MANGANESE AND MANGANESE NITRIDES

CROSS-REFERENCE TO RELATED APPLICATIONS

This application claims priority to U.S. Provisional Application No. 61/623,972, filed Apr. 13, 2012.

FIELD

Embodiments of the present invention relate generally to barrier layers in semiconductor devices, and methods of forming such barrier layers. More particularly, embodiments of the invention relate to films comprising manganese, manganese nitrides (MnNx), manganese silicates and selected dopants.

BACKGROUND

Microelectronic devices, such as semiconductors or integrated circuits, can include millions of electronic circuit devices such as transistors, capacitors, etc. To further increase the density of devices found on integrated circuits, even smaller feature sizes are desired. To achieve these smaller feature sizes, the size of conductive lines, vias, and interconnects, gates, etc. must be reduced. Reliable formation of multilevel interconnect structures is also necessary to increase circuit density and quality. Advances in fabrication techniques have enabled use of copper for conductive lines, interconnects, vias, and other structures. However, electromigration in interconnect structures becomes a greater hurdle to overcome, with decreased feature size and the increased use of copper for interconnections.

Tantalum nitride (TaN) is a copper barrier at film thicknesses greater than 10 Å, where the film is continuous. However, because a Ta atom is about 4 Å in diameter, TaN films around 5 Å thick are not continuous. For smaller nodes where thinner TaN is required, TaN by itself may be a discontinuous film, thus limiting its copper barrier properties. Current methods include a Ta layer on top of a TaN layer, which acts as a wetting layer for copper and provides the continuity of a barrier film. For smaller nodes (less than 32 nm), however, this method leads to larger line resistance and hence is not an adequate solution.

Physical vapor deposited (PVD) tantalum nitride (TaN) is a standard material for diffusion bathers in copper interconnections. Due to poor adhesion of copper to the TaN, a tantalum liner is also used to enhance the durability of the interconnect structures. As the dimension of copper interconnections are being reduced to sub-20 nm, the non-conformal nature of PVD TaN barrier plus Ta liner has caused issues, such as copper gap fill voiding and high line resistance. Atomic layer deposition (ALD) TaN is being used as an advanced technology with better conformality; however, the film quality of ALD TaN still needs significant improvements.

Therefore, there is a need in the art for thin layers that are effective copper barriers.

SUMMARY

One or more embodiments of the invention are directed to methods of forming a manganese-containing film. A substrate is provided exposed to a first precursor and a reactant. The first precursor comprises a manganese-containing organometallic compound to deposit a manganese-containing film. The manganese-containing organometallic compound has the formula

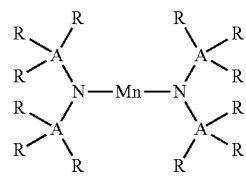

where each A is independently selected from carbon or silicon and each R is independently selected from hydrogen, methyl, substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics.

Some embodiments of the invention are directed to methods of forming a manganese-containing film. A substrate is provided that comprises a dielectric layer disposed thereon, the dielectric layer having a trench with an opening, a sidewall and a bottom. The substrate is exposed to a first precursor and a reactant. The first precursor comprises a manganese-containing organometallic compound to deposit a manganese-containing film on at least a portion of the sidewall and/or bottom of the trench. The manganese-containing organometallic compound has the formula of

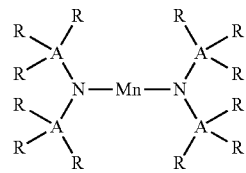

where each A is independently selected from carbon or silicon and each R is independently selected from hydrogen, methyl, substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics.

In some embodiments, the method further comprises depositing a conductive material comprising copper over the manganese containing film.

In one or more embodiments, the manganese-containing film further comprises one or more dopants selected from Co, Mn, Ru, Ta, Al, Mg, Cr, Nb, Ti and V. In some embodiments, the dopant is included by exposing the substrate to a second precursor and a reactant, the second precursor comprising a compound comprising the dopant element.

In one or more embodiments, the substrate is exposed to the first precursor and reactant substantially simultaneously. In some embodiments, the substrate is sequentially exposed to the first precursor and reactant.

In some embodiments, each A is nitrogen. In one or more embodiments, each R group is a methyl group. In one or more embodiments, the manganese-containing organometallic compound comprises manganese bis[bis(trimethylsilyl)amide].

In some embodiments, the reactant is one or more of ammonia and hydrogen. In one or more embodiments, the reactant comprises ammonia.

In some embodiments, the manganese-containing film comprises $MnN_x$ with x in the range of about 0.1 to about 3. Some embodiments further comprise treating the MnNx film to generate manganese silicate. In some embodiments, manganese silicate is formed on a dielectric layer.

Some embodiments further comprise exposing the substrate to a second precursor different from the first precursor and optionally a second reactant different from the reactant.

In one or more embodiments, the substrate comprises a dielectric layer disposed thereon, the dielectric layer having a trench with an opening, a sidewall and a bottom and the manganese-containing film is deposited on at least a portion of one or more of the sidewall and bottom of the trench. In some embodiments, the manganese-containing film is selectively deposited on one of the dielectric layer or substrate over the other of the dielectric layer and the substrate.

In one or more embodiments, manganese silicate is formed on the dielectric layer. In some embodiments, the manganese containing film is continuous at a thickness less than about 2 nm.

In some embodiments, there is substantially no manganese oxide in the manganese containing film.

Additional embodiments of the invention are directed to methods of forming interconnections in a microelectronic device. A substrate comprising a dielectric layer disposed thereon is provided. The dielectric layer has an opening that permits conduction to an underlying layer. The substrate is exposed to a first precursor and a reactant. The first precursor comprising a manganese-containing organometallic compound to deposit a manganese-containing film on at least a portion of the dielectric layer. The manganese-containing organometallic compound has the formula

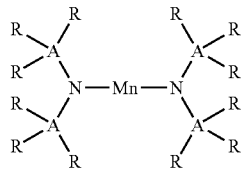

where each A is independently selected from carbon or silicon and each R is independently selected from hydrogen, methyl, substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics. A conductive material is deposited over the manganese-containing film. The conductive material may optionally be over the opening that permits conduction to an underlying layer.

Additional embodiments of the invention are directed to methods of forming interconnections in a microelectronic device. A substrate comprising a dielectric layer is provided. The dielectric layer having a trench with an opening, a sidewall and a bottom. The substrate is exposed to a first precursor and a reactant. The first precursor comprises a manganese-containing organometallic compound to deposit a manganese-containing film on at least a portion of the sidewall and/or bottom of the trench. The manganese-containing organometallic compound has a formula

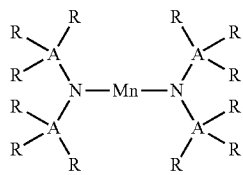

where each A is independently selected from carbon or silicon and each R is independently selected from hydrogen, methyl, substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics. A conductive material comprising Cu is deposited into the lined trench.

In some embodiments, the manganese containing film comprises manganese silicate at a surface of the dielectric transitioning to $MnN_x$. In one or more embodiments, the film comprises manganese silicate and the manganese silicate is directly deposited onto the substrate.

One or more embodiments further comprise exposing the first layer to plasma treatment prior to depositing the conductive material. In some embodiments, the plasma comprises one or more of He, Ar, $NH_3$, $H_2$ and $N_2$.

Further embodiments of the invention are directed to methods for forming interconnections in a microelectronic device. A substrate comprising a dielectric is provided. The dielectric layer having a trench with an opening, a sidewall and a bottom. The substrate is sequentially exposed to a first precursor and a reactant, the first precursor comprising a manganese-containing organometallic compound of the formula

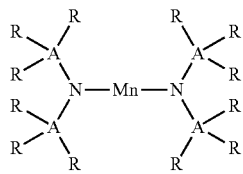

where each A is independently selected from carbon or silicon and each R is independently selected from hydrogen, methyl, substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics to deposit a manganese-containing film on at least a portion of the sidewall and/or bottom of the trench. A conductive material is deposited comprising Cu into the lined trench.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A and 1B illustrate a dielectric layer before and after deposition of a barrier layer and conductive fill material in accordance with one or more embodiments of the invention.

DETAILED DESCRIPTION

Figure 2:
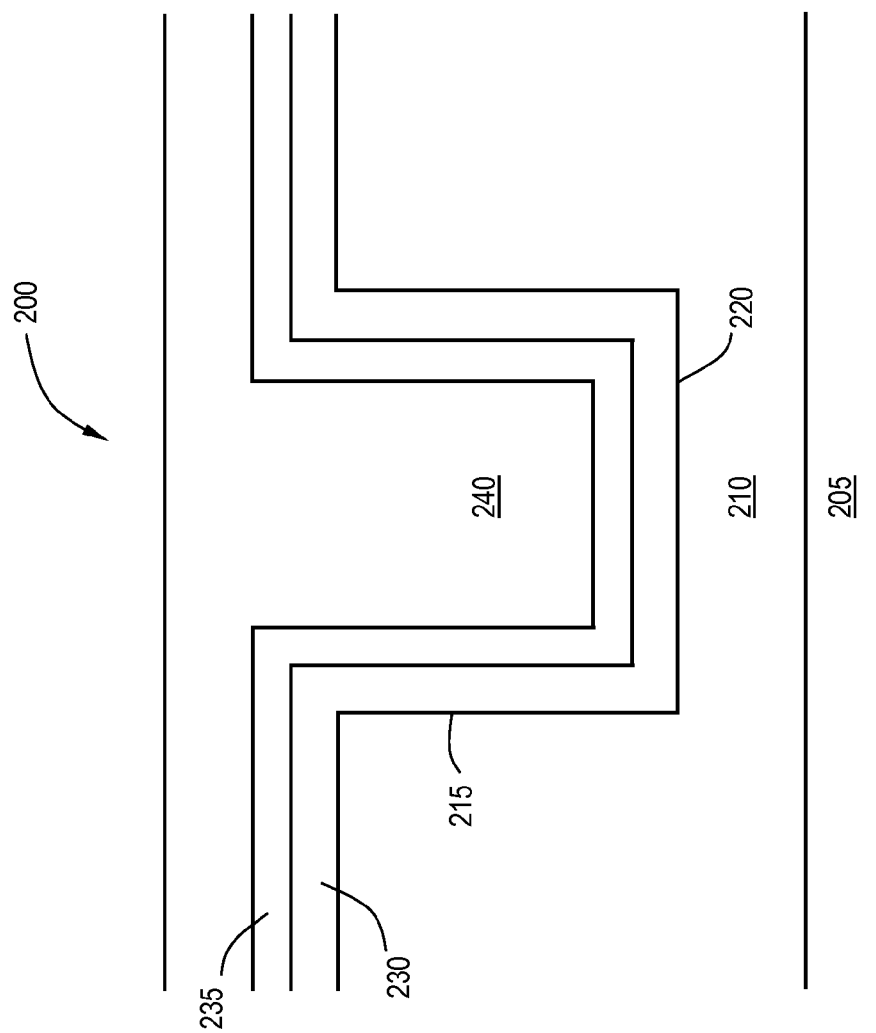
FIG. 2 illustrates a dielectric layer having a first layer, a second layer, and conductive fill material in accordance with one or more embodiments of the invention.

Before describing several exemplary embodiments of the invention, it is to be understood that the invention is not limited to the details of construction or process steps set forth in the following description. The invention is capable of other embodiments and of being practiced or being carried out in various ways Embodiments of the invention relate to the production of manganese (Mn) or manganese nitride ($MnN_x$) from an organometallic precursor. The deposition methods can be atomic layer deposition (ALD) or chemical vapor deposition (CVD). The organometallic precursor may include a manganese silyl amido complex. The deposited manganese or $MnN_x$ film can be used as an alternative diffusion barrier in the back-end-of-line copper interconnections to replace currently used PVD TaN or ALD TaN. The deposition approach can be integrated with the ALD TaN deposition to generate manganese doped TaN or tantalum doped with $MnN_x$.

Manganese or $MnN_x$ are new materials being proposed for these applications. Manganese can react with dielectric underlayers to form manganese silicates as the barrier. Without being bound to any particular theory of operation, it is believed that the $MnN_x$ is not only the diffusion bather but also promotes the adhesion between copper and the dielectrics.

There are few examples of CVD/ALD films of high quality and high purity $MnN_x$ or manganese. Some precursors have oxygen containing ligands, which leads to $MnO_x$ formation. Manganese oxides formed on copper surfaces has difficulty to segregate away and will increase the via resistance. Some precursors have extremely low vapor pressure and reaction rate, which poses challenges for chamber design and poor film morphology during ALD deposition. The precursor of some embodiments can generate a high purity manganese film by CVD and high purity $MnN_x$ films by ALD with smooth morphology.

ALD of $MnN_x$ from trimethyl silyl amido manganese complexes of some embodiments has been performed on standard ALD chambers. The film shows smooth surface morphology in all dielectric material tested including highly porous carbon doped low-k silicon dioxide. CVD of pure manganese from trimethyl silyl amido manganese can be obtained. The manganese can react with the underlayer dielectrics to form manganese silicates which are proven to be good diffusion barriers for copper.

One aspect of the invention relates to a microelectronic device comprising a substrate, a dielectric layer, a barrier layer, and a conductive material. FIG. 1A depicts an embodiment of a microelectronic device 100 comprising a substrate 105 and a dielectric layer 110. The dielectric layer 110 is disposed upon the substrate 105, and the dielectric layer 110 has a trench 150 defined by a trench bottom 120, sidewalls 115, and opening 160.

In one or more embodiments, the dielectric layer 110 is a low-k dielectric layer. In some embodiments, the dielectric layer comprises $SiO_x$. Further embodiments provide that the dielectric layer comprises porous carbon-doped $SiO_x$. In one or more embodiments, the dielectric layer is a porous carbon-doped $SiO_x$ layer with a k value less than 3.

FIG. 1B shows the same microelectronic device 100 after deposition of a barrier layer 130, which covers at least a portion of the sidewall 115 and/or trench bottom 120. As shown in FIG. 1B, the barrier layer 130 may cover the entirety of the sidewall 115 and trench bottom 120. The bather layer 130 may comprise $MnN_x$ and one or more dopants such as Co, Mn, Ru, Ta, Al, Mg, Cr, Nb, Ti or V.

In one or more embodiments, the bather layer comprises 0.1 to 10% dopant, based on the weight of the manganese layer. In some embodiments, the barrier layer comprises 0.2 to 8 wt. % dopant. In particular embodiments, the barrier layer comprises 0.5 to 5 wt. % dopant.

According to one or more embodiments, as used herein, "barrier layer" refers to a discrete layer formed by depositing TaN and one or more dopants, and excludes a region in which a second element or dopant diffuses into only a portion of the barrier layer. In other words, the dopant is present throughout the entire thickness of the TaN layer, and not only at a surface portion thereof.

A conductive fill material 140 fills at least a portion of the trench 150 lined with barrier layer 130. According to one or more embodiments, the conductive fill material comprises copper or a copper alloy. In other embodiments, the conductive fill material further comprises Al.

Although the conductive fill material 140 in FIG. 1B is shown in direct contact with the barrier layer 130, intermediate layers may be in between the conductive fill material 140 and the barrier layer 130, such as adhesion layers or seeding layers. According to one or more embodiments, the microelectronic device further comprises an adhesion layer comprising one or more of Ru and Co, Mn. In addition to Ru and/or Co, the adhesion layer may comprise one or more dopants such as Ta, Al, Mg, Cr, Nb, Ti or V. In a particular embodiment, the adhesion layer comprises Ru and Mn. In addition to traditional liners, manganese and manganese nitride can be used as liners. For example, when PVD Cu is replaced by CVD Cu, manganese nitride may be a promising liner. Also, manganese nitride can be reduced to Mn to act as a liner to promote the adhesion with Cu.

In some embodiments, a seeding layer is deposited on top of the bather layer. According to one or more embodiments, the seeding layer comprises an alloy of copper, such as a Cu—Mn alloy. In some embodiments, the seeding layer comprises less than about 5 wt. % Mn, less than about 4 wt. % Mn, less than about 3 wt. % Mn, or less than about 2 wt. % Mn. In one or more embodiments, the seeding layer comprises about 1 wt. % Mn. The line resistance of copper alloys containing 1 wt. % Mn is expected to be the same as or similar to the line resistance of pure copper.

While not wishing to be bound to any particular theory, it is thought that the dopant can selectively diffuse through the barrier layer 130 to the dielectric layer 110 and form a complex with the dielectric material that will be resistant to electromigration. Thus, in some embodiments, the Mn can diffuse through the barrier layer and form $MnSiO_x$. This self-forming bather layer of $MnSiO_x$ can then prevent copper electromigration from the conductive material 140 to the dielectric layer 110.

In addition to being a copper bather, doped manganese may also be a bather to oxygen diffusing from the dielectric layer 110 to the conductive material 140. Oxygen diffusion from the dielectric layer 110 to the conductive material 140 can result in oxygen reacting with components in the conductive material and/or seed layer. For example, oxygen can react with the layer at the interface of the barrier layer 130 and the conductive material 140, thus "pinning" the Mn to the barrier layer/conductive material interface. Similarly, if a seed layer comprising Mn is present, then oxygen can react with the Mn in the seed layer at the seed layer/barrier layer interface and pin the Mn to the interface.

In some embodiments, the substrate is exposed to a first precursor and a reactant. The exposure to these precursors can be substantially simultaneously, as in a CVD reaction, or sequentially, as in an ALD reaction. As used in this specification and the appended claims, the term "substantially simultaneously" means that the precursor and reactant gases are flowed into the chamber to react with each other and the substrate surface together. It will be understood by those skilled in the art that there may be areas of the substrate which are briefly exposed to one of the precursor and reactant gas only until the other diffuses to the same area.

In some embodiments, the manganese-containing organometallic compound of the formula

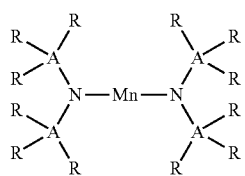

Each A is independently selected from carbon or silicon and each R is independently selected from hydrogen, methyl, substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics. The oxidation state of the manganese can be in any suitable oxidation state capable of reacting with the substrate or the reactant. In some embodiments, the manganese is Mn(II) or Mn(III).

The deposition of the manganese-containing film can be performed on a bare substrate surface or on a film already present on the substrate surface. For example, the manganese-containing film can be deposited on a dielectric film present on the surface. The dielectric film can have various structures (e.g., trenches) formed therein which have tops, bottoms and sidewalls. In some embodiments, there is a dielectric film with at least one trench having a sidewall and bottom. The bottom can be either the dielectric or a surface under the dielectric (e.g., bare substrate or another material). The deposition of the manganese-containing film can be selective for the difference surfaces. In some embodiments, the deposition of the manganese-containing film is selective for the dielectric layer or the underlying layer.

In some embodiments, each A is a nitrogen atom. In one or more embodiments, each R group is a methyl. In some embodiments, the manganese-containing organometallic compound comprises manganese bis[bis(trimethylsilyl) amide].

In some embodiments, the reactant is one or more of ammonia and hydrogen. Without being bound by any particular theory of operation, it is believed that the Mn—N bonds are broken during film formation. Therefore, as an example, if ammonia is used, a manganese nitride film can be formed. Whereas, if hydrogen is used as the reactant, a manganese film can be formed.

In some embodiments, the manganese film comprises $MnN_x$. The x of some embodiments is in the range of about 0.1 to about 3, or in the range of about 0.2 to about 2, or in the range of about 0.25 to about 1. The manganese nitride film can be subjected to a post-deposition process by which a manganese silicate is formed. In some embodiments, the film comprises manganese silicate and may be formed directly on the dielectric layer. In one or more embodiments, the manganese film comprises manganese silicate near the dielectric surface and manganese nitride further from the surface. The transition from the silicate to the nitride can be gradual or in discrete steps.

In some embodiments, the manganese containing film is continuous at a thickness less than about 2 nm. As used in this specification and the appended claims, the term "continuous" means that there are no gaps in the film greater than about 10% of the total film area. In some embodiments, the film is continuous at a thickness less than 3 nm, 2.5 nm, 1.5 nm, 1 nm or 0.5 nm.

In some embodiments, there is substantially no manganese oxide in the manganese containing film. As used in this specification and the appended claims, the term "substantially no" means that there is less than about 5 atomic percent manganese oxide in the layer. In some embodiments, there is less than about 4 atomic %, 3 atomic %, 2 atomic % or 1 atomic % manganese oxide.

FIG. 2 illustrates a microelectronic device 200 with a substrate 205 and a dielectric layer 210. The dielectric layer 210 has sidewalls 215 and trench bottom 220, which are at least partially covered by a first layer 230. The first layer 230 may be a barrier layer comprising manganese silicate. A second layer 235 is disposed upon the first layer 230, and may comprise one or more of manganese or manganese nitride. The second layer may further comprise one or more dopants such as Ta, Al, Mg, Cr, Nb, Ti or V. The transition between the first layer 230 and the second layer 235 can be smooth, as in a gradient composition, or in discrete steps.

A conductive fill material 240 is deposited in the remainder of the trench defined by sidewall 215 and trench bottom 220. According to one or more embodiments, the conductive fill material comprises copper or a copper alloy. In further embodiments, the conductive fill material also comprises Mn. The conductive material 240 may be deposited directly on the second layer 235, or may be deposited on a seeding layer (not shown) on top of the second layer 235. According to one or more embodiments, the seeding layer comprises an alloy of copper, such as Mn, Co and Ru. In some embodiments, the seeding layer comprises less than about 5% Mn, or less than about 4% Mn, or less than about 3% Mn, or less than about 2% Mn or less than about 1% Mn.

In addition to the films described above, another aspect of the invention relates to a method for forming interconnections in a microelectronic device comprising providing a substrate with a dielectric layer disposed thereon, depositing a barrier layer upon the dielectric layer, and depositing a conductive material upon the barrier layer. According to one or more embodiments of this aspect, the barrier layer comprises manganese nitride and a dopant selected from Mn, Co, Ru, Ta, Al, Mg, Cr, Nb, Ti and V.

The manganese layer (metallic, nitride or silicide) may be formed by any appropriate deposition process. For example, the manganese layer can be deposited by an alternating layer deposition (ALD) process or a plasma enhanced atomic layer deposition (PEALD). The dopant can then be deposited by chemical vapor deposition (CVD), physical vapor deposition (PVD) or ALD. The dopant is then diffused into the manganese-containing layer to form an integrated manganese-containing dopant layer. The dopant may be diffused into the manganese-containing layer through various processes, including by plasma treatment and by heating.

Alternatively, the manganese and the dopant can be deposited in alternating layers. In accordance with this embodiment, a first manganese-containing layer, such as a manganese monolayer, is deposited on a dielectric film. While a dielectric film is described as the underlying layer for deposition of the manganese-containing film, it will be understood that the underlying layer can be any suitable layer including, but not limited to, a metal layer or a base substrate. A first dopant layer, such as a layer of dopant, dopant alloy or other dopant-containing compound, is then deposited on top of the first manganese-containing layer. This first dopant layer can also be a monolayer. A second manganese-containing layer is then deposited on top of the first dopant layer. This process is repeated until a doped manganese-containing film of the desired thickness is produced. The ratio of manganese-containing layers to dopant layers can be any suitable combination and is not limited to 1:1. For example, there can be ten manganese-containing layers deposited for every one dopant layer.

In some embodiments, there are more than one precursors gases flowed into the processing chamber, either simultaneously or separately. For example, a manganese-containing precursor and a cobalt precursor can be flowed into the chamber together to react with the surface. The reactant employed can be specific for one of the precursor species or common to both species. In some embodiments, the substrate or surface is exposed to a first precursor followed by a first reactant and to a second precursor different from the first precursor followed by either the first reactant or by a second reactant different from the first reactant.

For depositing the dopant metal, an appropriate metal-containing precursor may be used. Examples of suitable precursors include metal complexes containing the desired dopant, such as dopant metals coordinated with organic or carbonyl ligands. A suitable dopant precursor should have sufficient vapor pressure to be deposited in the appropriate process, such as ALD, CVD and PVD. Depending on the dopant precursor used, a co-reactant may be used to deposit the dopant. For example, reducing gases such as hydrogen and ammonia can be used as co-reactants for depositing some dopants.

Some embodiments of the invention provide that the doped manganese-containing film is treated with a plasma prior to depositing the conductive material. According to one or more embodiments, the plasma comprises one or more of He, Ar, $NH_3$, $H_2$ and $N_2$. The conductive material may be deposited in a variety of ways, including by an electroless deposition process, an electroplating (ECP) process, a CVD process or a PVD process. In some embodiments, a first seed layer is deposited upon the barrier layer, and a bulk conductive layer is then formed upon the seed layer.

The films in accordance with various embodiments of this invention can be deposited over virtually any substrate material. A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride, aluminum, copper, or any other conductor or conductive or non-conductive bather layer useful for device fabrication. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

As embodiments of the invention provide a method for depositing or forming doped manganese-containing films, a processing chamber is configured to expose the substrate to a sequence of gases and/or plasmas during the vapor deposition process. The processing chamber would include separate supplies of reactants, along with any supply of carrier, purge and inert gases such as argon and nitrogen in fluid communication with gas inlets for each of the reactants and gases. Each inlet may be controlled by an appropriate flow controller such as a mass flow controller or volume flow controller in communication with a central processing unit (CPU) that allows flow of each of the reactants to the substrate to perform a deposition process as described herein. The central processing unit may be one of any forms of a computer processor that can be used in an industrial setting for controlling various chambers and sub-processors. The CPU can be coupled to a memory and may be one or more of readily available memory such as random access memory (RAM), read only memory (ROM), flash memory, compact disc, floppy disk, hard disk, or any other form of local or remote digital storage. Support circuits can be coupled to the CPU to support the CPU in a conventional manner. These circuits include cache, power supplies, clock circuits, input/output circuitry, subsystems, and the like.

In atomic layer deposition type chambers, the substrate can be exposed to the first precursors and reactant either spatially or temporally separated processes. Temporal ALD, also referred to as time-domain ALD, is a traditional process in which the first precursor flows into the chamber to react (e.g., chemisorption) with the surface. The first precursor is purged from the chamber before flowing the reactant into the chamber. In spatial ALD, both the first precursor and reactant gases are simultaneously flowed to the chamber but are separated spatially so that there is a region between the flows that prevents mixing of the precursors. Often, the is a gas curtain (e.g., purge gases, vacuum ports or combinations thereof) between the first precursor and reactant to ensure separation. In spatial ALD, the substrate must be moved relative to the gas distribution plate, or vice-versa, so that each part of a substrate is exposed to both the first precursor and the reactant gases.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and exposed to the deposition gases at different positions.

The co-reactants are typically in vapor or gas form. The reactants may be delivered with a carrier gas. A carrier gas, a purge gas, a deposition gas, or other process gas may contain nitrogen, hydrogen, argon, neon, helium, or combinations thereof. The various plasmas described herein, such as the nitrogen plasma or the inert gas plasma, may be ignited from and/or contain a plasma co-reactant gas.

In one or more embodiments, the various gases for the process may be pulsed into an inlet, through a gas channel, from various holes or outlets, and into a central channel. In one or more embodiments, the deposition gases may be sequentially pulsed to and through a showerhead. Alternatively, as described above, the gases can flow simultaneously through gas supply nozzle or head and the substrate and/or the gas supply head can be moved so that the substrate is sequentially exposed to the gases.

In another embodiment, a manganese-containing film may be formed during plasma enhanced atomic layer deposition (PEALD) process that provides sequential pulses of precursors and plasma. In specific embodiments, the co-reactant may involve a plasma. In other embodiments involving the use of plasma, during the plasma step the reagents are generally ionized during the process, though this might occur only upstream of the deposition chamber such that ions or other energetic or light emitting species are not in direct contact with the depositing film, this configuration often termed a remote plasma. Thus in this type of PEALD process, the plasma is generated external from the processing chamber, such as by a remote plasma generator system. During PEALD processes, a plasma may be generated from a microwave (MW) frequency generator or a radio frequency (RF) generator. Although plasmas may be used during the deposition processes disclosed herein, it should be noted that plasmas are not required. Indeed, other embodiments relate to deposition processes under very mild conditions without a plasma.

Another aspect of the invention pertains to an apparatus for deposition of a film on a substrate to perform a process according to any of the embodiments described above. In one embodiment, the apparatus comprises a deposition chamber for deposition of a film on a substrate. The chamber comprises a process area for supporting a substrate. The apparatus includes a precursor inlet in fluid communication with a supply of a manganese precursor, such as manganese [bis(bis (trimethylsilyl)amide]. The apparatus also includes a reactant gas inlet in fluid communication with a supply of nitrogen-containing precursor, such as ammonia. The apparatus also includes a reactant gas inlet in fluid communication with a supply of dopant precursor, such as a dopant-containing metal complex. The apparatus further includes a purge gas inlet in fluid communication with a purge gas. The apparatus can further include a vacuum port for removing gas from the deposition chamber. The apparatus can further include an auxiliary gas inlet for supplying one or more auxiliary gases such as inert gases to the deposition chamber. The deposition can further include a means for heating the substrate by radiant and/or resistive heat.

In some embodiments, a plasma system and processing chambers or systems which may be used during methods described here for depositing or forming the films can be performed on either PRODUCER®, CENTURA®, or ENDURA® systems, all available from Applied Materials, Inc., located in Santa Clara, Calif. A detailed description of an ALD processing chamber may be found in commonly assigned U.S. Pat. Nos. 6,821,563, 6,878,206, 6,916,398, and 7,780,785.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of forming a manganese-containing film, the method comprising:
providing a substrate and exposing the substrate to a first precursor and a reactant, the first precursor comprising a manganese-containing organometallic compound to deposit a manganese-containing film, wherein the manganese-containing organometallic compound comprises manganese bis[bis(trimethylsilyl)amide] or a compound of the formula

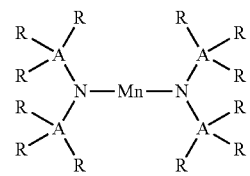

where each A is nitrogen and each R is independently selected from hydrogen, methyl, substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics.

2. The method of claim 1, wherein the manganese containing film further comprises one or more dopants selected from Co, Mn, Ru, Ta, Al, Mg, Cr, Nb, Ti and V.

3. The method of claim 2, wherein the dopant is included by exposing the substrate to a second precursor and a reactant, the second precursor comprising a compound comprising the dopant element.

4. The method of claim 1, wherein the substrate is exposed to the first precursor and reactant substantially simultaneously.

5. The method of claim 1, wherein the substrate is sequentially exposed to the first precursor and reactant.

6. The method of claim 1, wherein each R group is a methyl.

7. The method of claim 1, wherein the reactant is one or more of ammonia and hydrogen.

8. The method of claim 1, wherein the reactant comprises ammonia.

9. The method of claim 1, wherein the manganese film is $MnN_x$ and x is in the range of about 0.1 to about 3.

10. The method of claim 9, further comprising treating the MnNx film to generate manganese silicate.

11. The method of claim 1, wherein manganese silicate is deposited on the substrate.

12. The method of claim 1, wherein the manganese containing film is continuous at a thickness less than about 2 nm.

13. The method of claim 1, further comprising exposing the substrate to a second precursor different from the first precursor and optionally a second reactant different from the reactant.

14. The method of claim 1, wherein the substrate comprising a dielectric layer disposed thereon, the dielectric layer having a trench with an opening, a sidewall and a bottom and the manganese-containing film is deposited on at least a portion of one or more of the sidewall and bottom of the trench.

15. The method of claim 14, wherein the manganese-containing film is selectively deposited on one of the dielectric layer or substrate relative to the other of the dielectric layer and the substrate.

16. A method for forming interconnections in a microelectronic device, the method comprising:
providing a substrate comprising a dielectric layer disposed thereon, the dielectric layer an opening that permits conduction to an underlying layer,
sequentially exposing the substrate to a first precursor and a reactant, the first precursor comprising a manganese-containing organometallic compound to deposit a manganese-containing film on at least a portion of the dielectric layer, wherein the manganese-containing organometallic compound comprises manganese bis[bis(trimethylsilyl)amide] or a compound of the formula

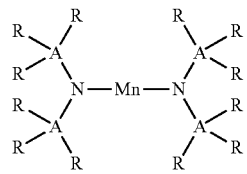

where each A is nitrogen and each R is independently selected from hydrogen, methyl, substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics; and
depositing a conductive material over the manganese-containing film that may also be over the opening that permits conduction to an underlying layer.

17. The method of claim 13, wherein the manganese-containing film comprises manganese silicate at a surface of the dielectric transitioning to $MnN_x$.

18. The method of claim 13, further comprising exposing the manganese-containing film to plasma treatment prior to depositing the conductive material.

* * * * *